(12) United States Patent
Lappoehn

(10) Patent No.: US 10,601,156 B2
(45) Date of Patent: Mar. 24, 2020

(54) PLUG CONTACT SET AND METHOD FOR CHECKING A LATCHING OF THE PLUG CONTACT SET

(71) Applicant: ERNI Production GmbH & Co. KG, Adelberg (DE)

(72) Inventor: Juergen Lappoehn, Gammelshausen (DE)

(73) Assignee: ERNI PRODUCTION GMBH & CO. KG, Adelberg (DE)

( * ) Notice: Subject to any disclaimer, the term of this patent is extended or adjusted under 35 U.S.C. 154(b) by 0 days.

(21) Appl. No.: 16/300,667

(22) PCT Filed: Mar. 22, 2017

(86) PCT No.: PCT/DE2017/100229
§ 371 (c)(1),
(2) Date: Nov. 12, 2018

(87) PCT Pub. No.: WO2017/194044
PCT Pub. Date: Nov. 16, 2017

(65) Prior Publication Data
US 2019/0296466 A1    Sep. 26, 2019

(30) Foreign Application Priority Data

May 13, 2016   (DE) .................. 10 2016 108 989

(51) Int. Cl.
*H01R 12/70*     (2011.01)
*H01R 13/641*    (2006.01)
(Continued)

(52) U.S. Cl.
CPC ....... *H01R 12/7023* (2013.01); *H01R 12/721* (2013.01); *H01R 13/6273* (2013.01); *H01R 13/641* (2013.01)

(58) Field of Classification Search
CPC ............ H01R 23/7073; H01R 23/7068; H01R 13/6275; H01R 13/6272; H01R 13/641;
(Continued)

(56) References Cited

U.S. PATENT DOCUMENTS

| | | |
|---|---|---|
| 4,927,382 A | 5/1990 | Huber |
| 5,088,931 A | 2/1992 | Niciolo et al. |

(Continued)

FOREIGN PATENT DOCUMENTS

| | | |
|---|---|---|
| DE | 38 38 657 A1 | 5/1990 |
| DE | 20 2016 102 037 U1 | 5/2016 |
| EP | 0 314 949 A1 | 5/1989 |

OTHER PUBLICATIONS

International Search Report of PCT/DE2017/100229, dated Jun. 14, 2017.
(Continued)

*Primary Examiner* — Gary F Paumen
(74) *Attorney, Agent, or Firm* — Collard & Roe, P.C.

(57) ABSTRACT

Plug contact set, comprising a plug contact strip (17) having several first contact elements (12, 14) that are formed as components of a circuit board (10) and are arranged in the region of a circuit board edge (19), at least one of which contact elements (12, 14) being formed in the plugging direction (S) as a checking contact (14) having a smaller length than the remaining contact elements, and having a plug connector having several second contact elements (22) that are arranged in a housing, at least one of which contact elements (22) being set up to electrically make electric contact with the checking contact (14), wherein at least one first latch element (31, 51) that is formed as part of the circuit board (10) is arranged on the circuit board edge (19) and at least one second latch element (32) is arranged on the housing, said latch elements being set up to latch with one another when the first contact elements (12, 14) are com- (Continued)

pletely contacted by the second contact elements (22), and wherein a third latch element (33, 53) that is formed as part of the circuit board (10) and that is able to latch to the second latch element (32) is provided that is arranged to be spaced apart from the first latch element (31) in the plugging direction (S) in such a way that, by latching the third latch element (33, 53) to the second latch element (32), an as clearance-free as possible fixing of the housing on the circuit board (10) in the completely contacted state of the first and second plug contacts (12, 14, 22) is achieved.

18 Claims, 12 Drawing Sheets

(51) Int. Cl.
  *H01R 13/627* (2006.01)
  *H01R 12/72* (2011.01)
(58) Field of Classification Search
  CPC ............ H01R 13/6273; H01R 12/7023; H01R 12/721
  USPC .......................................... 439/79, 357, 951
  See application file for complete search history.

(56) References Cited

U.S. PATENT DOCUMENTS

| | | | |
|---|---|---|---|
| 7,646,085 B2* | 1/2010 | Nishizawa | H01R 12/721 257/679 |
| 9,905,944 B2* | 2/2018 | Little | H01R 13/6658 |
| 2004/0192092 A1 | 9/2004 | Borrego Bel et al. | |
| 2005/0196995 A1 | 9/2005 | Cheng et al. | |
| 2007/0001279 A1 | 1/2007 | Nishizawa et al. | |
| 2010/0167570 A1 | 7/2010 | Yang et al. | |
| 2013/0330940 A1 | 12/2013 | Hasse et al. | |
| 2014/0162492 A1 | 6/2014 | Kiyooka et al. | |
| 2015/0214673 A1 | 7/2015 | Gao et al. | |
| 2015/0255905 A1 | 9/2015 | Little et al. | |

OTHER PUBLICATIONS

German Office Action dated Apr. 27, 2017 in German Application No. 10 2016 108 989.3 with English translation of the relevant parts.
English translation of the Chinese Office Action dated Aug. 6, 2019 in Chinese Application No. 201780029732.5.
European Office Action dated Oct. 14, 2019 in European Application No. 17 718 471.0 with English translation of the relevant parts.

* cited by examiner

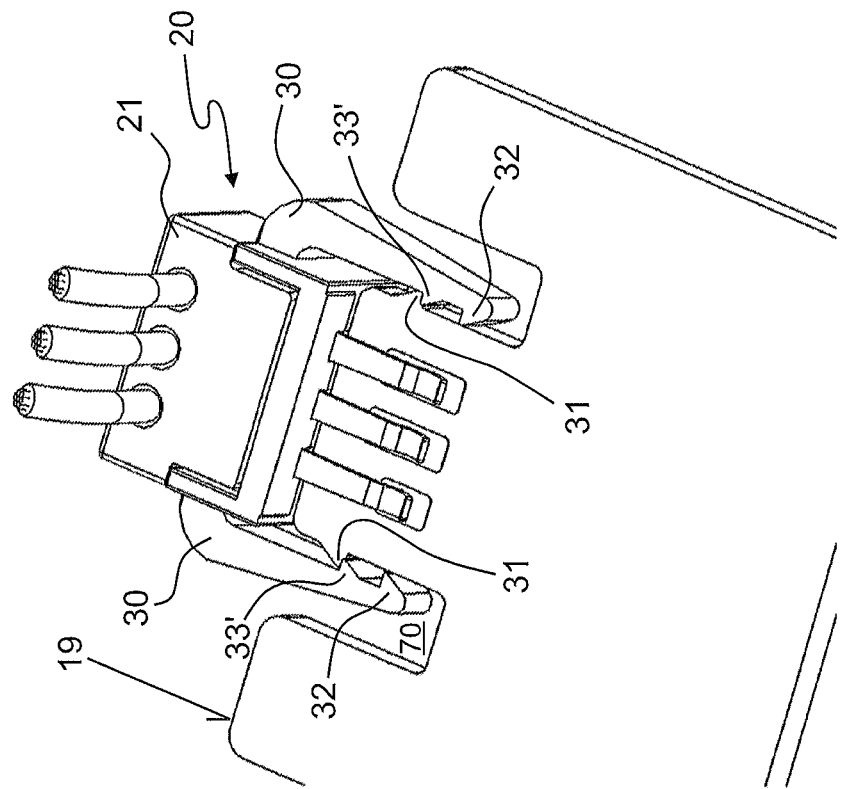
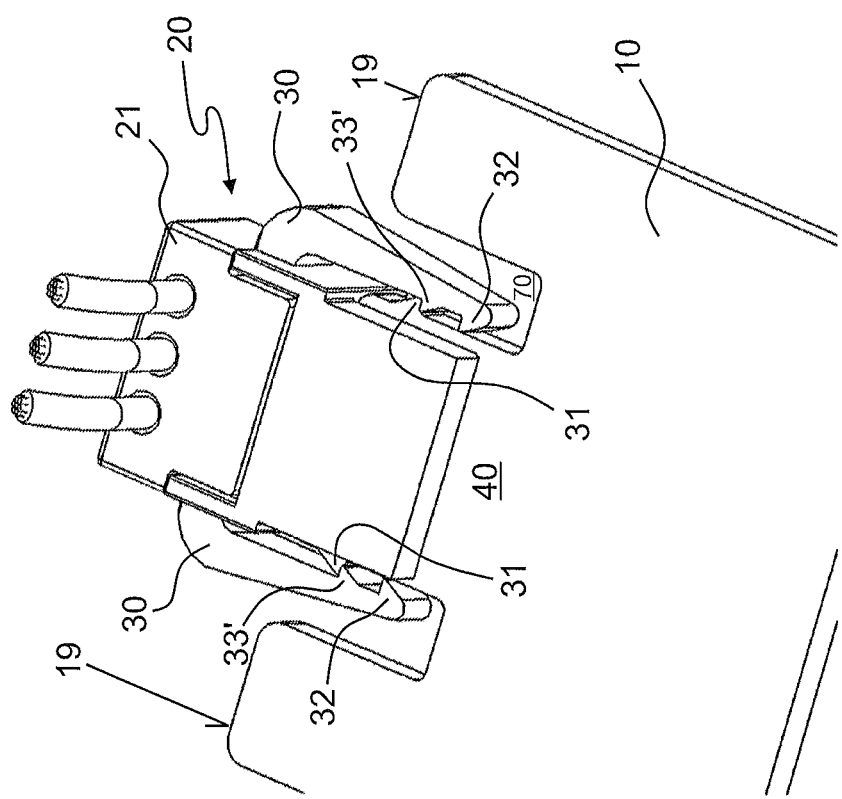

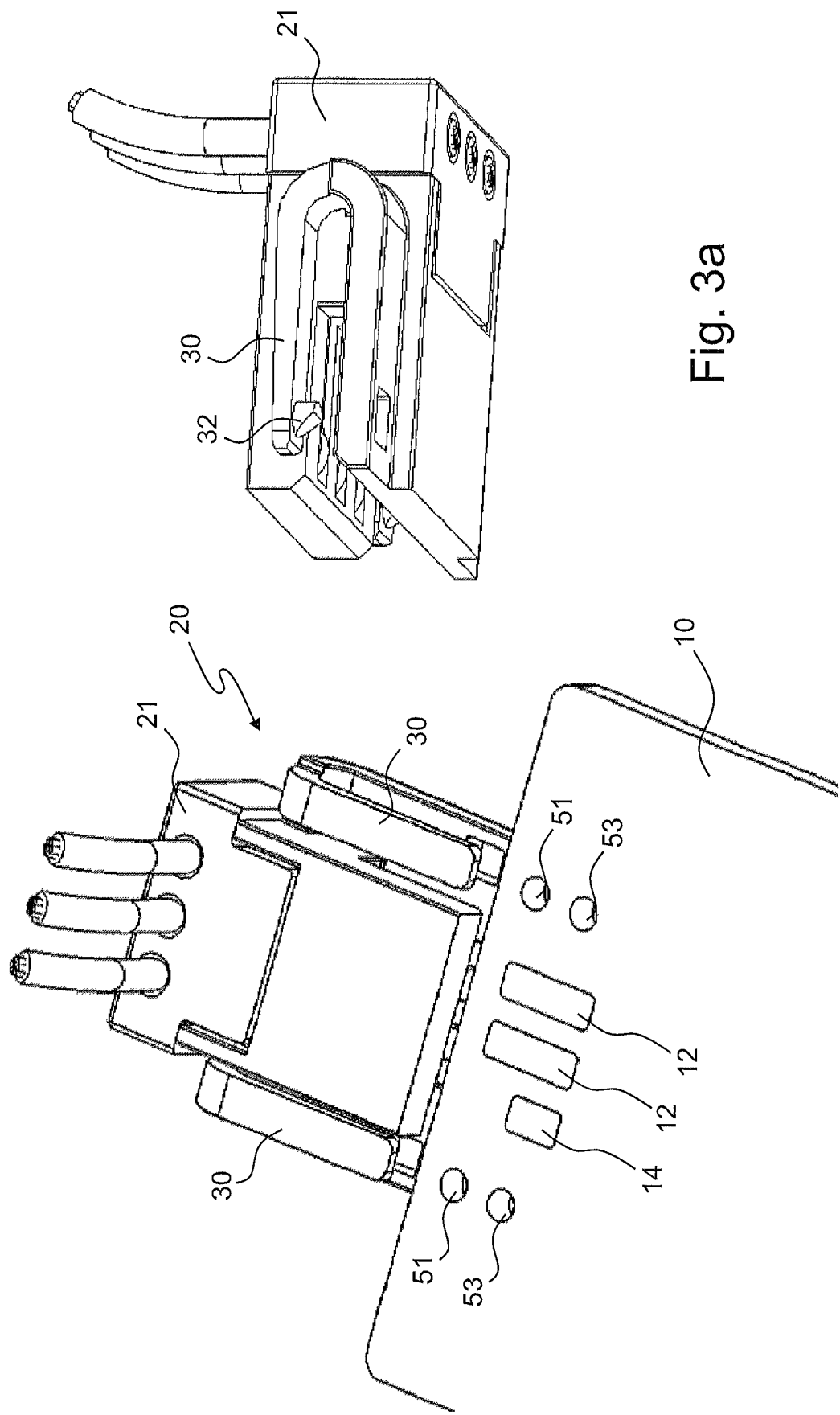

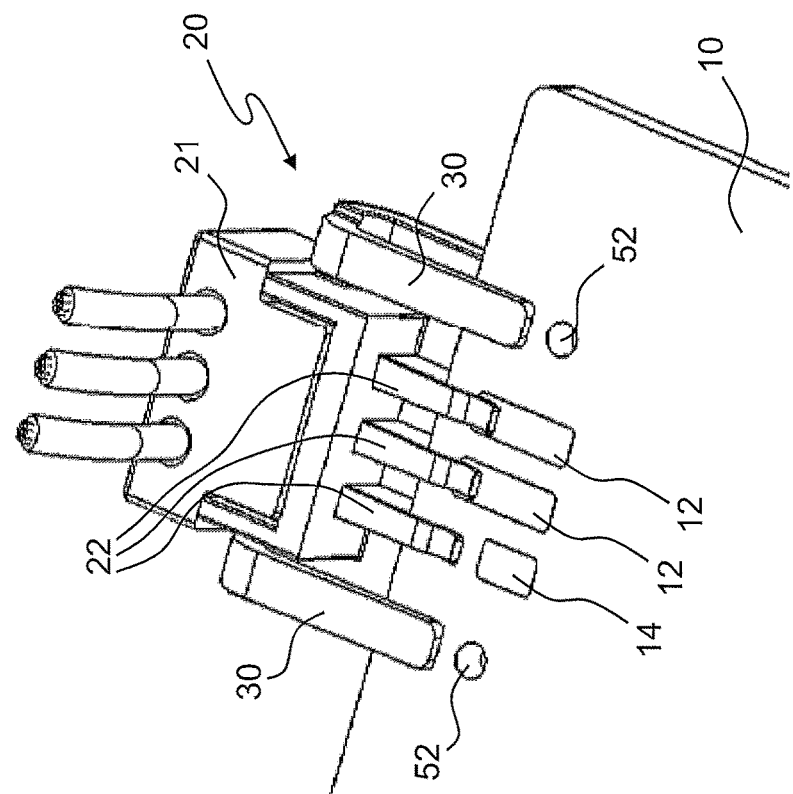
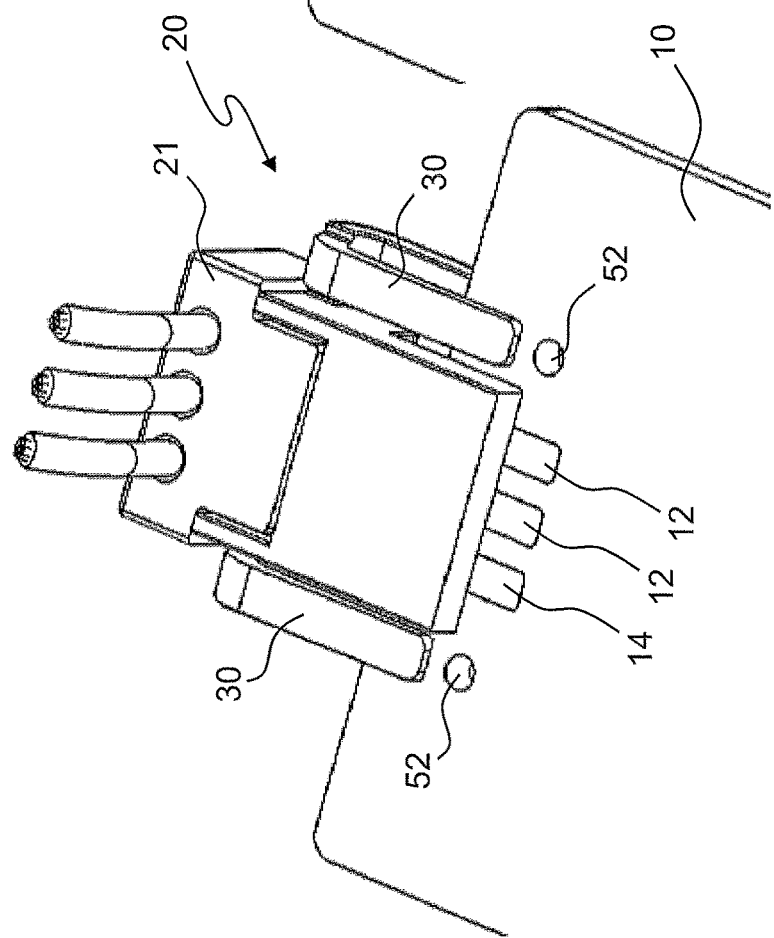
Fig. 3c
Fig. 3b

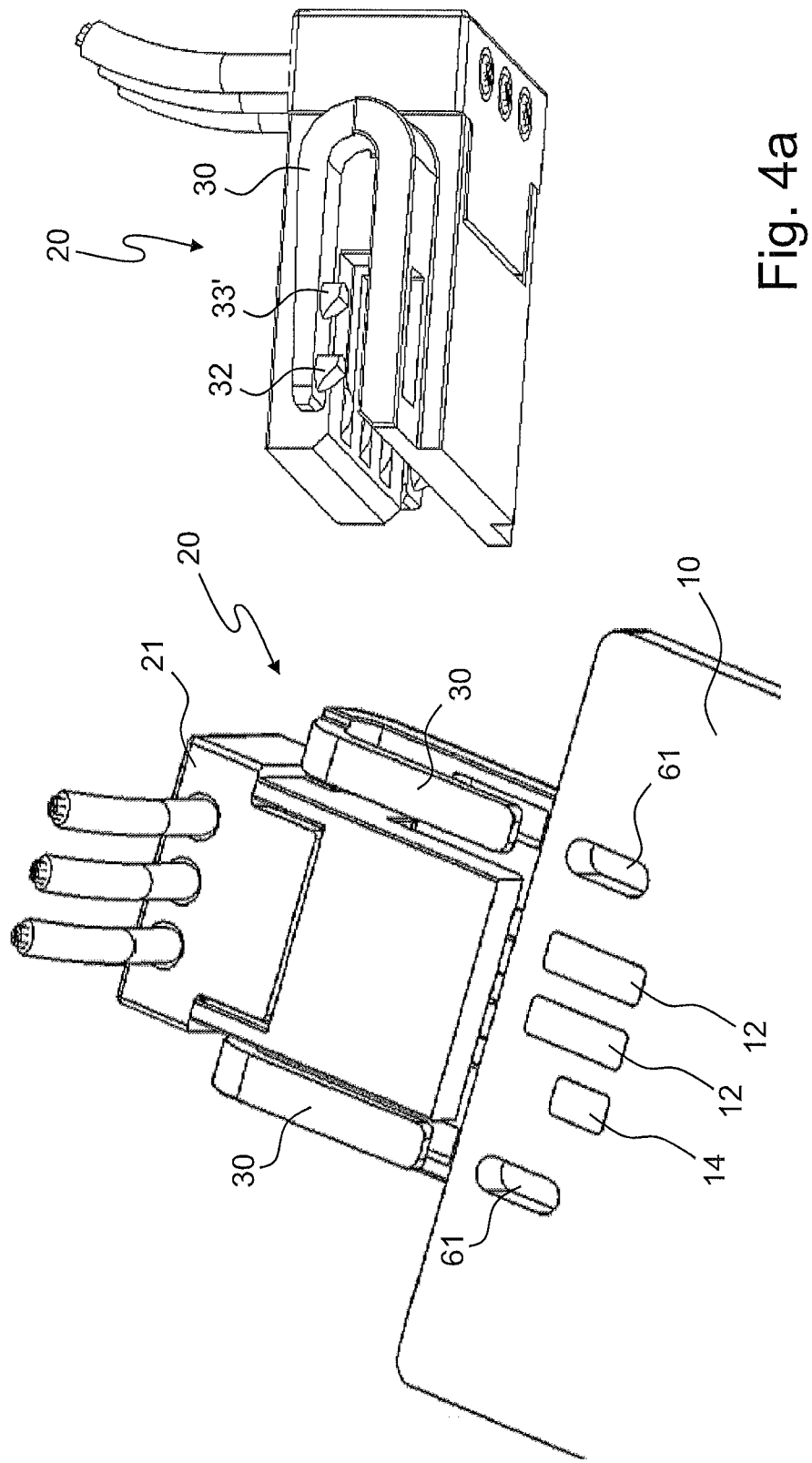

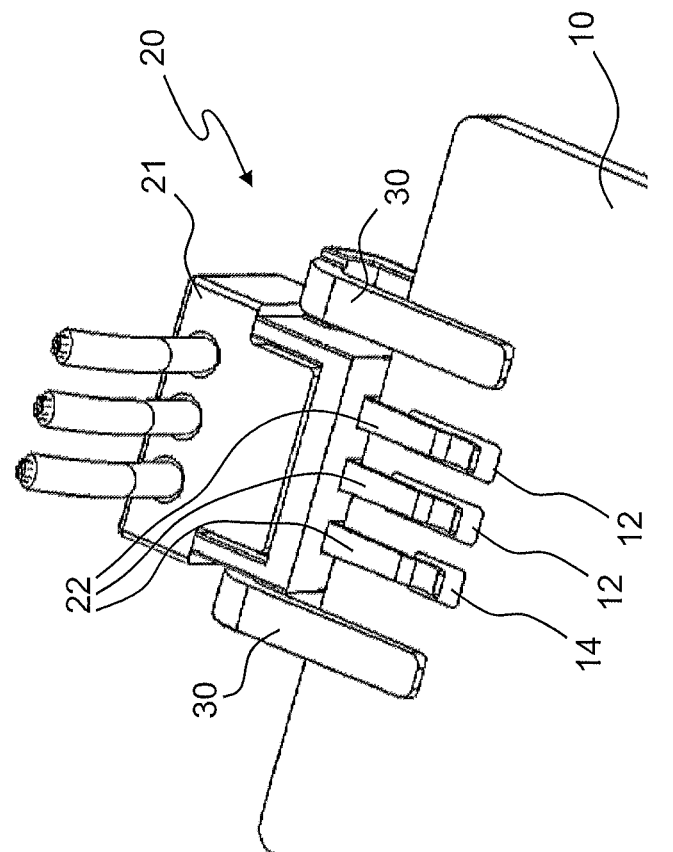
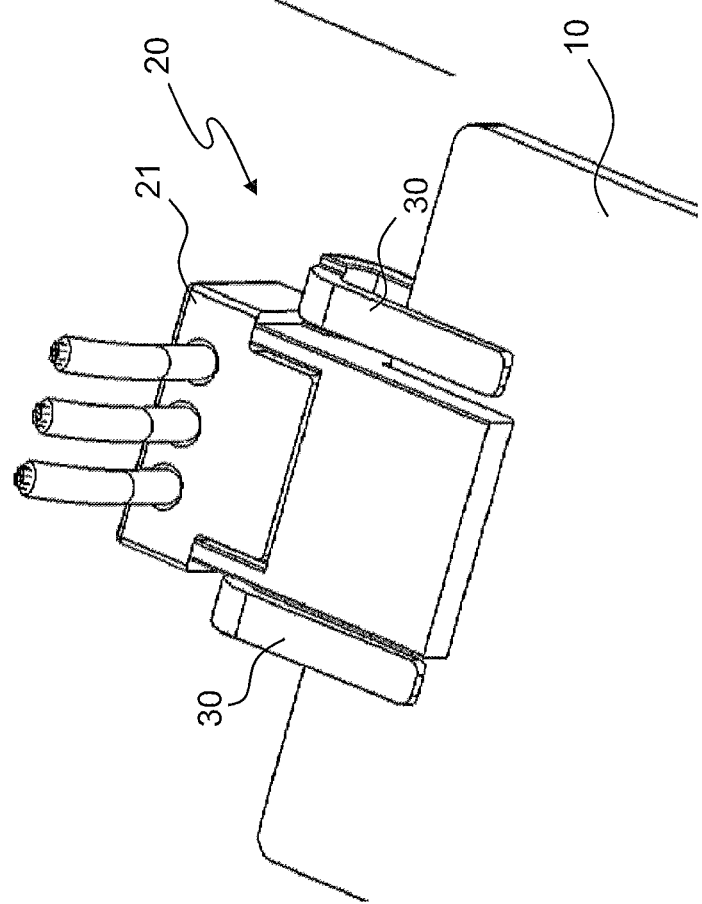
Fig. 4e
Fig. 4d

PLUG CONTACT SET AND METHOD FOR CHECKING A LATCHING OF THE PLUG CONTACT SET

CROSS REFERENCE TO RELATED APPLICATIONS

This application is National Stage of PCT/DE2017/100229 filed on Mar. 22, 2017, which claims priority under 35 U.S.C. § 119 of German Application No. 10 2016 108 989.3 filed on May 13, 2016, the disclosure of which is incorporated by reference. The international application under PCT article 21 (2) was not published in English.

The present invention relates to a plug contact set, comprising a plug contact strip having several first contact elements that are formed as components of a circuit board and are arranged in the region of a circuit board edge, and having a plug connector having second contact elements, said plug connector being formed as a circuit board direct plug connector. The invention also relates to a method for checking a latching at least of one latch element of the plug contact strip and at least one latch element of the plug connector.

Such circuit board direct plug connectors are mounted directly on a corresponding plug contact strip that is formed on a circuit board edge. In this way, a plug contact strip that is also arranged on the circuit board, for example, and is electrically contacted by corresponding contact elements on the circuit board, is avoided. Instead, corresponding contact elements on the circuit board itself form the counterpart to the circuit board direct plug connector.

Such circuit board direct plug connectors are also used in assembly groups that are used to a large extent in modern motor vehicles. During the operation of the vehicle, such plug connections are subjected to considerable loads, for example shaking loads, vibration loads and similar. Because of these loads, it can result in the plug connector dislodging from the plug contact strip and thus in a loss of electric contacting. In order to prevent this, the plug connectors and the corresponding counterpart, for example a plug contact strip, must be provided with latch elements that prevent the plug connector from unintentionally dislodging from the plug contact strip or from the circuit board edge. When assembling the plug connectors, these latch elements are latched together in order to produce a connection between the plug connector and the corresponding counterpart, i.e. for example a plug contact strip or the circuit board, said connection not being able to be detached by a load occurring in the motor vehicle.

Because of assembly errors, it can result in a so-called half-plugging of a plug connector into a plug contact strip. Here, an electric contact between the plug contacts of the plug contact strip and plug contacts of the plug connector is indeed produced, however no engagement of the latch elements takes place. Because of a spatially close arrangement of plug contact sets in motor vehicles, such a half-plugging is generally not visually recognisable. A half-plugging can also not be detected by measuring the current flow between plug contact strip and plug connector since there is an electric contact between plug connector and plug contact strip that is not able to be distinguished from the desired complete plugging. A loss of the electric contacting between plug connector and plug contact strip can only emerge during operation of the motor vehicle which is indeed detected by the On-Board Diagnostics (OBD) of the motor vehicle, however can only be rectified in a workshop. In order to be able to detect such a half-plugging, it has now been proposed to form at least one plug contact as a so-called checking contact with a smaller length than the rest of the plug contacts. This checking contact occurs only in electric contact with a corresponding plug contact in the plug connector when a complete plugging, i.e. a complete plugging between the plug connector and plug contact strip, has taken place. In order to ensure this complete plugging, even over long periods of time, first and second latch elements are provided that are latched to one another when such a complete plugging has taken place. Such a plug contact set emerges, for example, from EP 0 314 949 A1. The proper plugging is thus determined by checking whether an energisation of the checking contact or the corresponding plug contact in the plug contact strip can be detected in the corresponding contact of the counterpart, i.e. the plug connector or the plug contact strip. Only when a current flow is able to be detected, a proper plugging can be assumed.

These plug contact sets have a longitudinal clearance of about 0.9 mm to 1.00 mm. At the start of plugging, i.e. when exploiting the maximum longitudinal clearance, the plug connector and the plug contact strip are latched to each other by the first and second latch elements and indeed all plug contacts are contacted electrically conductive, but not the checking contact. The longitudinal clearance is required in order to compensate the tolerances of the blade contact element and the spring contact element that form the checking contact. During assembly, the plug connectors are pushed onto the contact strips. In doing so it is necessary that the plug connectors be pushed up to the base of the plug contact strip. In this case, all plug contacts and also the checking contact are electrically correctly contacted. In the present case, by the term electrically "correctly contacted", not only an accidental touch of the two contact elements, for example the tip of a blade contact element and the spring contact element, is to be understood, but a complete contacting, for example by the blade contact elements moving completely into the spring contact elements. Now, it can occur during assembly that a plug connector within the longitudinal clearance is again somewhat dislodged from the plug contact strip because, for example, the cables that lead to the plug connectors have been pulled on, or similar. This can also still occur after a proper plugging of the plug connector. When the plug connector has thus been dislodged so far from the plug contact strip that the longitudinal clearance has been used fully, it then occurs that the checking contact of the plug connector is no longer electrically conductively connected to the corresponding plug contacts of the plug contact strip. In this case, a defect described above is signalised that is labelled as a so-called pseudo error during production. They are called "pseudo errors" because there is in fact no error present, since the plug contacts, i.e. the utility contacts, in this case are all correctly contacted, with the exception of the checking contact. During assembly, this is indeed determined as an error. Such an error is thus particularly disruptive and disadvantageous because, even when visually inspecting the plug contact set, a proper plugging is able to be detected since the latch elements are indeed latched to one another. Such an erroneous contacting is particularly disruptive during assembly since, during the assembly process, erroneous contacting are signalled that delay the assembly process.

DISCLOSURE OF THE INVENTION

According to the invention, a third latch element is thus provided for the plug contact set that either, with a first variant according to the invention, latches to the second latch element or, in a second variant according to the invention, latches to the first latch element. This third latch element is arranged in the plugging direction, in the first variant, to be spaced apart from the first latch element and, in the second variant, to be spaced apart from the second latch element in such a way that as clearance-free as possible fixing of the plug housing on the circuit board in the completely contacted state of the first and second plug contacts is achieved by latching the third latch element with the first or second latch element.

In the first variant, it is provided here that the first and third latch elements are formed on the circuit board itself, while the second latch element is arranged on the housing of the circuit board direct plug connector and vice versa in the second variant, only the first latch element is arranged on the circuit board and the second and third latch elements are arranged on the housing of the circuit board direct plug connector. Both solutions according to the invention are, however, of equal value and differ from each other substantially only in the production of the latch elements on the circuit board respectively on the housing or on the elements of the housing of the direct plug connector.

During the assembly process, a secure contacting of the checking contact with the corresponding plug contact is ensured by this third latch element which is also able to be latched to the first or second latch element and which enables a fixing of the housing that is as clearance-free as possible on the circuit board in the completely contacted state of the first and second plug contacts by the engagement, and thus error reports are avoided because of the previously mentioned clearance which can lead to a non-contacting of the checking contact. Furthermore, dislodging the housing from the corresponding plug connector of the circuit board, i.e. dislodging the circuit board direct plug connector from the plug contact strip of the circuit board during the operation of, for example, a vehicle is effectively prevented. It is further ensured by this third latch element that the plug connector is completely plugged into the plug contact strip and remains in this state. "Readjusting" the plug connector in this way is no longer necessary. Such a readjustment is, for example, then always necessary in plug connectors known from prior art when a current interruption is detected on the checking contact. The first and simple way of checking whether a defect is present is then to once again press the plug connector a little harder onto the circuit board, which must be carried out by the assembler during assembly. Such an additional assembly process can be very disadvantageous, in particular with many plug connectors to be assembled. By the solution according to the invention it is possible that, when latching the third latch element into the first or second latch element, it is ensured that a complete plugging of the plug contacts is present and the circuit board direct plug connector and the circuit board are connected to each other in such a way that even shaking loads and other mechanical loads cannot lead to a de-contacting of the plug contacts.

The first contact elements are advantageously arranged on the circuit board. The contact elements arranged on the circuit board are preferably metal surfaces that are arranged directly—like conductor tracks—on the surface of the conductor tracks, in particular next to one another, and thus form the plug contact strip.

Furthermore, it is preferably provided that the first and third latch elements are formed in or on the circuit board as a part thereof.

According to one embodiment, the first and third latch elements are each arranged on edges that border, transverse to the plugging direction, a plugging tongue that is formed as part of the circuit board.

The plugging tongue can, for example, be arranged in an edge-side recess of the circuit board. Purely in principle, it is also conceivable that it protrudes beyond the circuit board.

According to an alternative embodiment, it is provided that the first and third latch elements are openings in the circuit board. In this case, the plugging tongue can be completely dispensed with and the first and third latch elements are formed, for example, as bores in the circuit board, in particular to be adjacent to the edge thereof.

In these cases, the second latch elements are preferably arranged on spring arms arranged on the housing. These spring arms overlap the latch elements formed on the circuit board or engage with these during the plugging process and secure the housing of the circuit board direct plug connector on the circuit board after plugging.

With the second variant according to the invention, it is provided that the first latch elements are formed as part of the circuit board. With this second solution according to the invention, it is provided that the second and third latch elements are arranged on the spring arms arranged on the housing.

In all cases, the latch elements can preferably be formed as latch hooks. These latch hooks particularly advantageously interact with the spring arms springily hinged inwards onto the latch elements.

Purely in principle, in particular with very long plug contact strips having very many plug contacts, more than one checking contact could be provided. One advantageous embodiment provides precisely one checking contact. Even with one checking contact, a proper plugging can be examined. The remaining plug contacts can thus be available for other purposes.

It is preferably provided that this checking contact is arranged centrally in the contact strip. It is, in turn, determined by this arrangement whether an even plugging, i.e. a plugging that in particular is not tilted or slanting, but rather parallel, of the plug connector into the contact strip of the circuit board has been carried out. Only in this case does no current interruption occur.

The checking contact has—as already mentioned above—a smaller length than the other plug contacts in the plug contact strip. The remaining plug contacts, in comparison, have substantially the same length.

Thus, the checking contact is formed to be so short that it does not come into electric contact with a second plug contact when the at least one first latch element is not latched to the at least one second latch element. In doing so it is determined whether the plug has been properly plugged. The plug contact set advantageously has three latch points, a first latch point, a second latch point and a third latch point. The at least one first latch element is latched in all three latch points with the at least one second latch element and thus the first latch point is chosen in such a way that a second plug contact does not electrically contact the checking contact. In the second latch point, at least one second plug contact electrically contacts the checking contact and in the third latch point, all first and second plug contacts are in contact with one another and the two housing parts are fixed to each other. The second latch point is therefore the latch point that usually represents a proper plugging. The third latch point corresponds to the second latch point, however here it is absolutely ensured that all plug contacts are contacted with one another and the two housing parts are fixed to be virtually clearance-free.

Preferably, the first contact elements are contact surfaces on the circuit board and the second contact elements are advantageously formed as spring contact elements that, in the contacted state, rest on the contact elements under a preload.

These embodiments of the plug contact set according to the invention enable two methods for checking a latching of the at least one latch element to the at least one second latch element and to the at least one third latch element. There can hereby be differentiation between whether the plug contact strip is latched to the plug connector in the desired manner or whether a half-plugging without latching is present that can be additionally caused because of shaking loads or other mechanical loads.

In one embodiment of the method according to the invention, a latching of the at least one first latch element to the at least one second and third latch element is checked by the checking contact being energised and checking whether a current is flowing between the checking contact and a second plug contact. If such a current flow is detected, it is determined that a latching is present. Thus, either the checking contact or the second plug contact that is set up in order to electrically contact the checking contact can be energised.

BRIEF DESCRIPTION OF THE DRAWINGS

An exemplary embodiment of the invention is depicted in the drawings and is explained in more detail in the description below.

FIG. 2d shows the plug connector set according to FIGS. 2b and 2c in the completely plugged state in its end position;

FIG. 2e shows the plug connector set according to FIG. 2d in a partially broken-away state for illustrating the complete plugging of all plug contacts;

FIG. 3a shows an isometric depiction of a third variant of a plug connector set according to the invention from a circuit board direct plug connector also shown separately and circuit board in the not yet plugged state;

FIG. 3b shows the plug contact set depicted in FIG. 3a in the not yet completely plugged state and FIG. 3c shows the plug connector set according to FIG. 3b in a partially broken-away state for illustrating the non-plugging of the checking contact;

FIG. 4a shows an isometric depiction of a fourth variant of a plug connector set according to the invention from a circuit board direct plug connector also shown separately and circuit board in the not yet plugged state;

FIG. 4d shows the plug connector set according to FIGS. 4b and 4c in the completely plugged state in its end position;

FIG. 4e shows the plug connector set according to FIG. 4d in a partially broken-away state for illustrating the complete plugging of all plug contacts;

EXEMPLARY EMBODIMENTS OF THE INVENTION

Figure 1A:
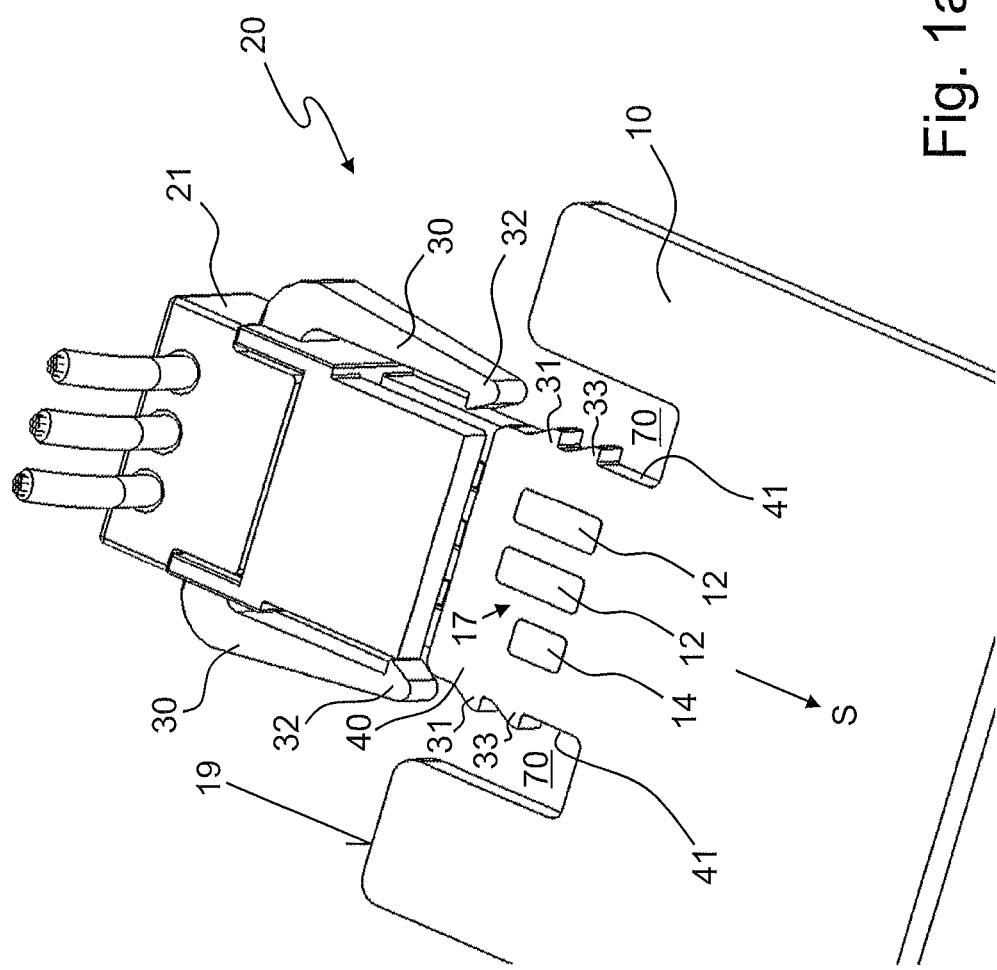
FIG. 1a shows an isometric depiction of a first variant of a plug contact set according to the invention from a circuit board direct plug connector and circuit board in the not yet plugged state.

In FIGS. 1a to 1e, a first variant of a plug contact set made from a circuit board direct plug connector 20 and a circuit board 10 is depicted. The circuit board 10 has a recess 70 on a circuit board edge 19, a protrusion in the shape of a plugging tongue 40 being arranged in said recess 70, on which plugging tongue 40 in turn a plug contact strip 17, consisting of a checking contact element 14 and plug contact elements 12, is arranged. The checking contact element 14 and the plug contact elements 12 are, for example, conducting surfaces on the surface of the circuit board 10. The circuit board direct plug connector 20 has a housing 21 on which spring arms 30 are springily hinged towards the plugging tongue 40. On their lower end, the spring arms 30 have two latch elements 32 in the shape of latch hooks. First latch elements 31 are arranged on the plugging tongue 40 on the bordering edges 41 thereof, in each case perpendicular to the plugging direction S. Third latch elements 33 are arranged to be spaced apart from the first latch elements 31 in the plugging direction S. Both the first latch elements 31 and the third latch elements 33 are formed as latch hooks that engage with the latch hooks formed as second latch elements 32. In doing so, the spring hinging of the spring arms 30 has proved to be particularly advantageous. The circuit board direct plug connector 20 is pushed in the plugging direction S onto the plugging tongue 40 until the first latch elements 31 and the second latch elements 32 are latched. In this state, the plug contacts 12 are electrically connected to corresponding contact elements 22 of the circuit board direct plug connector 20 that are formed as spring contact elements. The corresponding plug contact element 22 and the checking contact 14 are not connected to be electrically conductive.

The function of the checking contact 14 will be addressed below. Firstly, however, an alternative plug contact set to the circuit board direct plug connector 20 and circuit board 10 is described with respect to FIGS. 2a to 2e. Here the same elements are provided with the same reference numerals such that reference can be made to their description above. In contrast to the solutions depicted in FIG. 1a to 1e, here the third latch element 33', however, is not arranged on the edges 41 of the plugging tongue 40, but rather as a part of the spring arms 30. The third latch element 33', in this case, is spaced apart from the second latch element 32 against the plugging direction S while, with the first solution according to the invention, it is spaced apart from the latch element 31 in the plugging direction S.

Figure 2A:
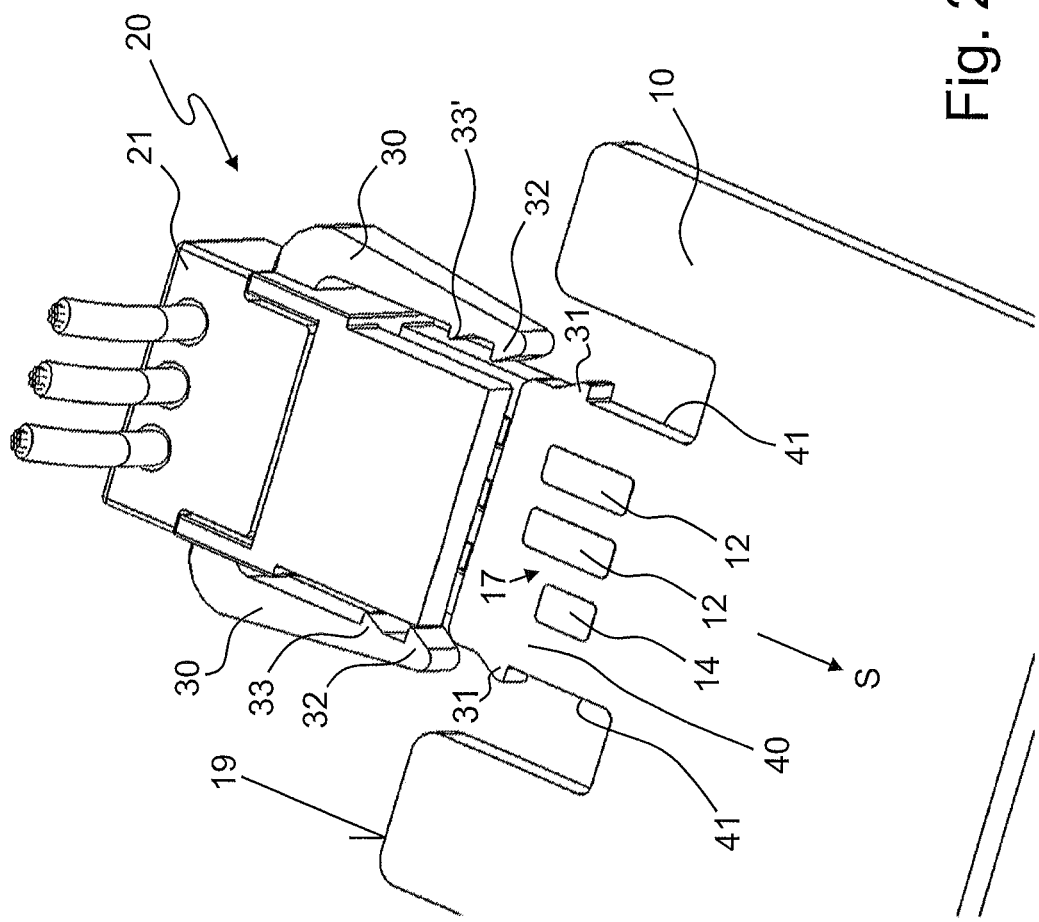
FIG. 2a shows an isometric depiction of a second variant of a plug contact set according to the invention from a circuit board direct plug connector and circuit board in the not yet plugged state.
Figure 2C:
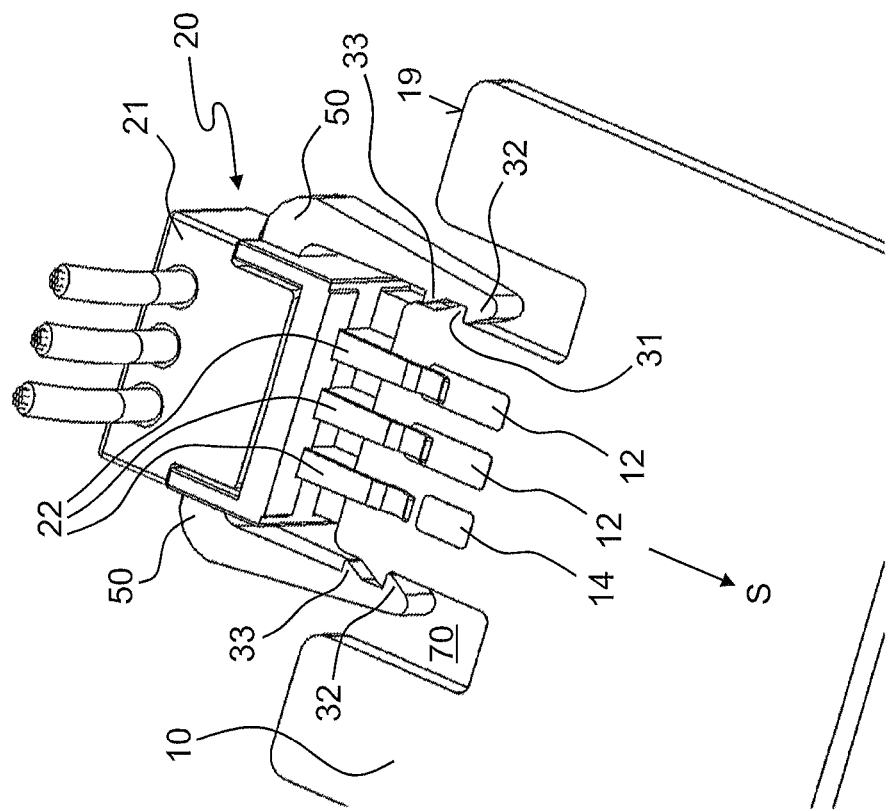
FIG. 2b shows the plug contact set depicted in FIG. 2a in the not yet completely plugged state and FIG. 2c shows the plug connector set according to FIG. 2b in a partially broken-away state for illustrating the non-plugging of the checking contact.
Figure 2B:
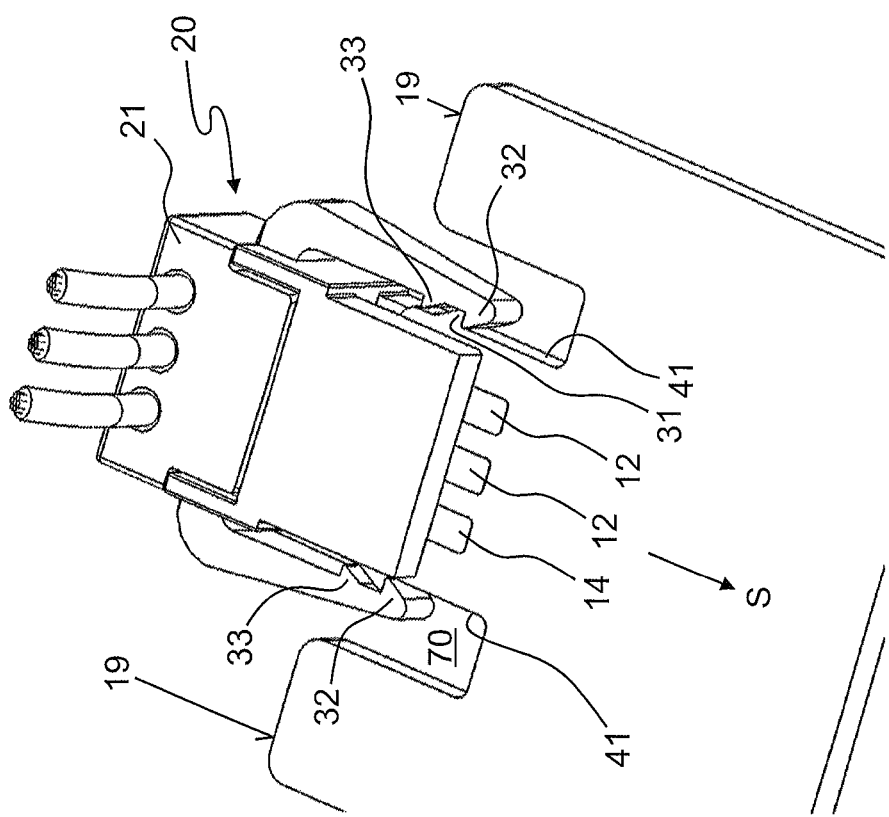
Figure 3E:
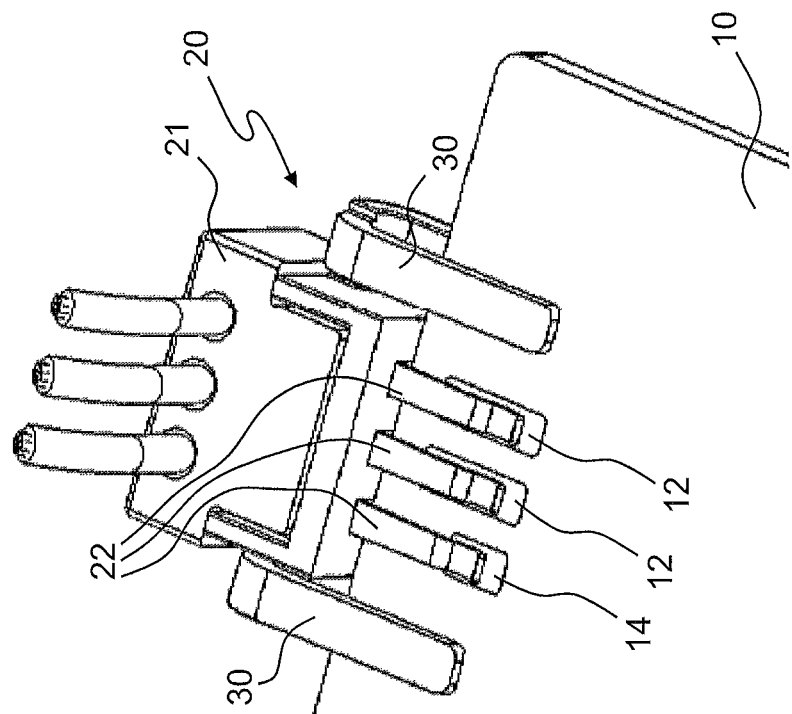
FIG. 3e shows the plug connector set according to FIG. 3d in a partially broken-away state for illustrating the complete plugging of all plug contacts.
Figure 3D:
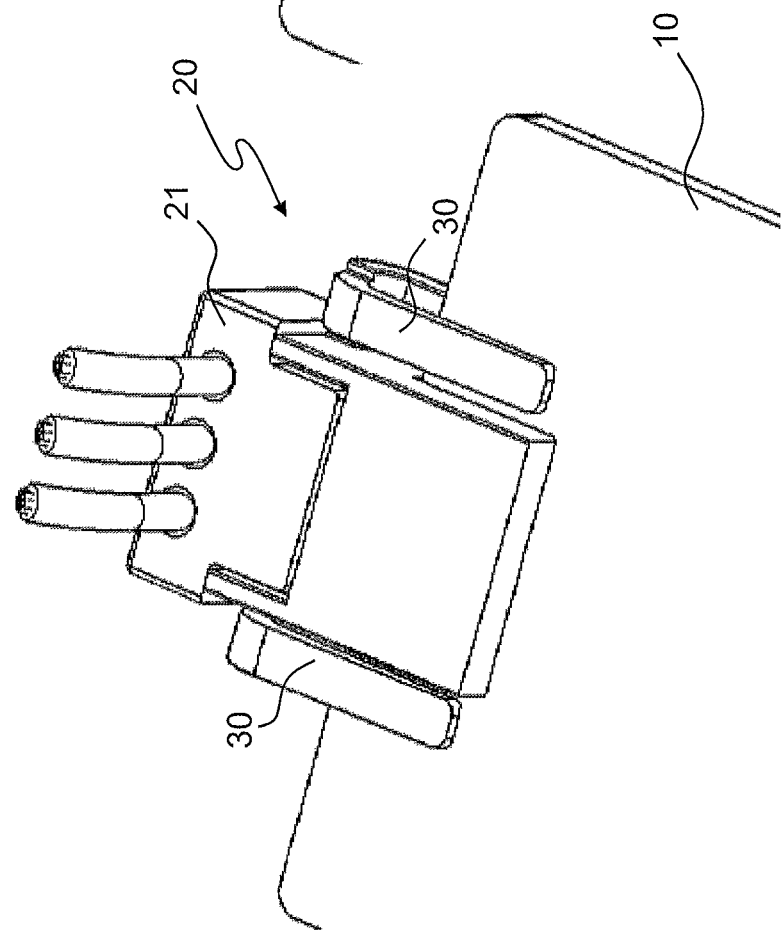
FIG. 3d shows the plug connector set according to FIGS. 3b and 3c in the completely plugged state in its end position.
Figure 4C:
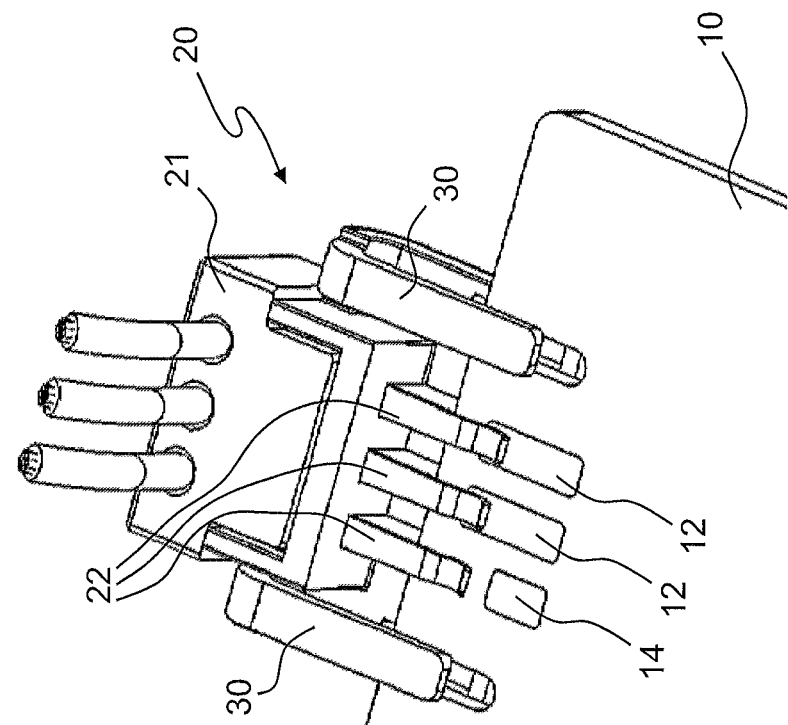
FIG. 4b shows the plug contact set depicted in FIG. 4a in the not yet completely plugged state and FIG. 4c shows the plug connector set according to FIG. 4b in a partially broken-away state for illustrating the non-plugging of the checking contact.
Figure 4B:
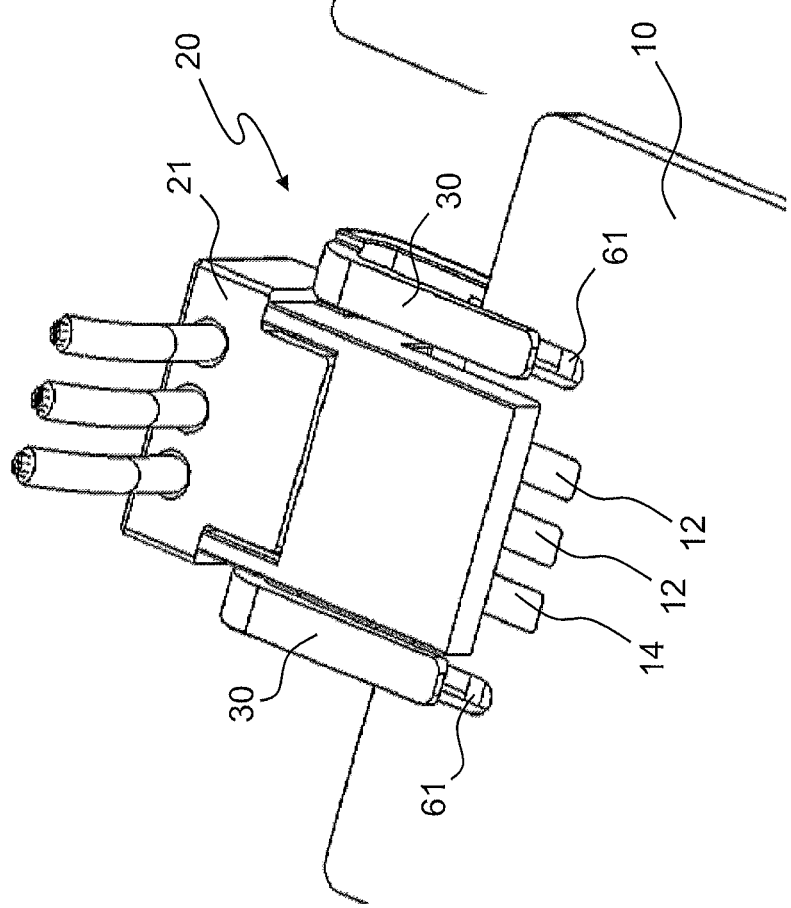

FIGS. 2b and 2c, in turn, show a plugging in which contact elements 12 are electrically connected to corresponding contact elements 22 of the circuit board direct plug connector 20, however the checking contact 14 is not electrically connected to the corresponding contact element 22.

Figure 1C:
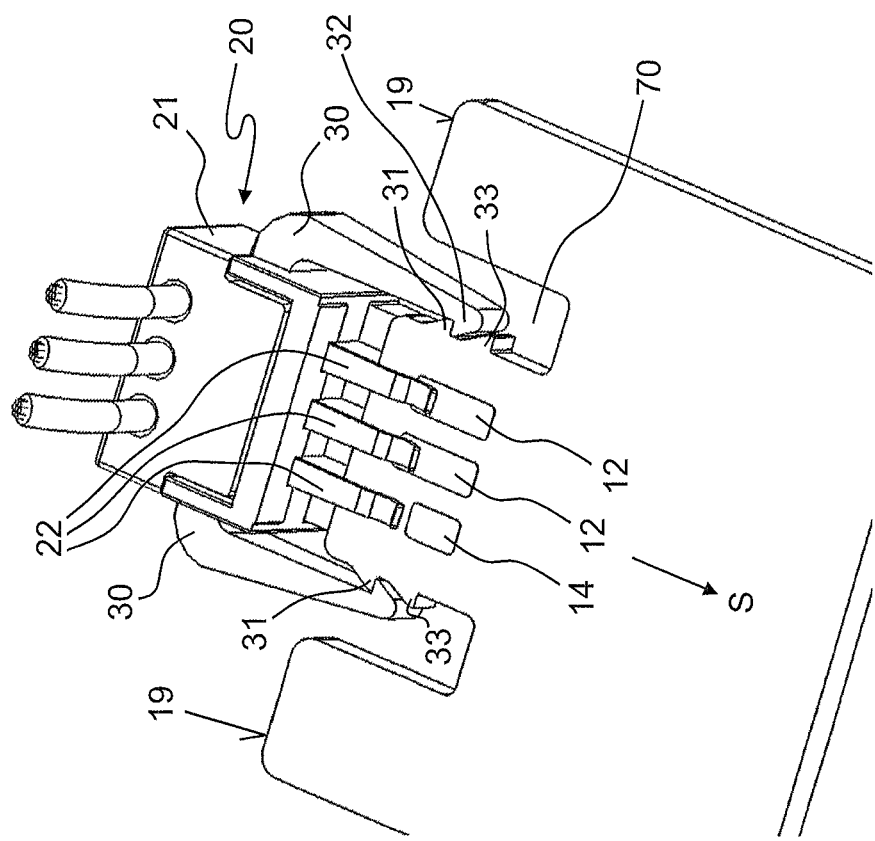
FIG. 1b shows the plug contact set depicted in FIG. 1a in the not completely plugged state and FIG. 1c shows the plug connector set according to FIG. 1b in a partially broken-away state for illustrating the non-plugging of the checking contact.
Figure 1B:
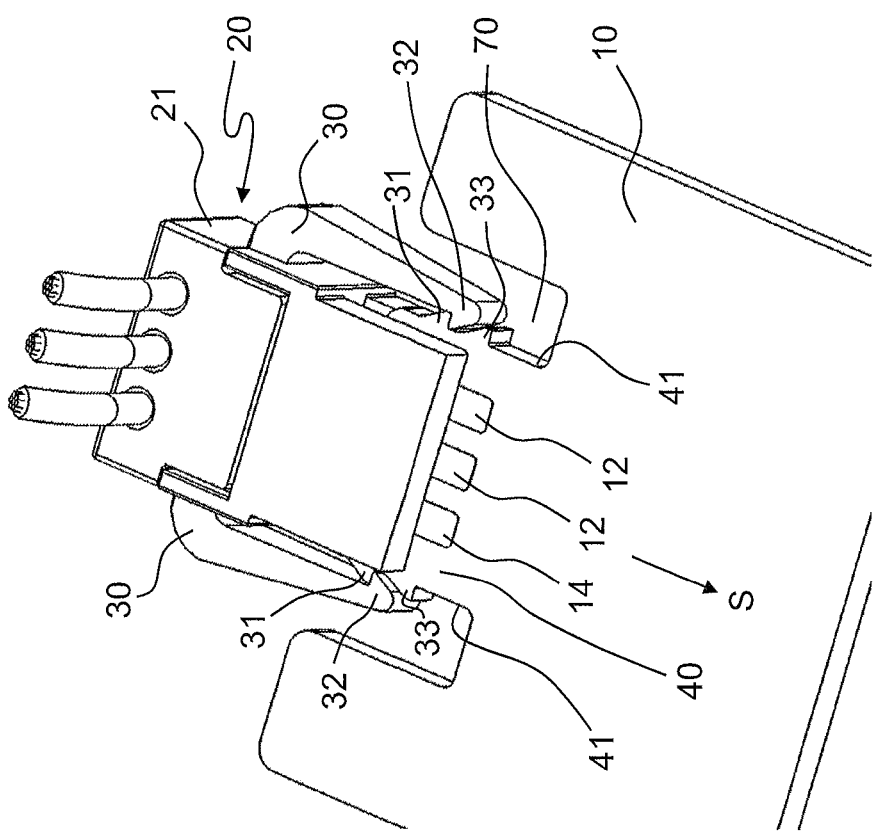
Figure 1E:
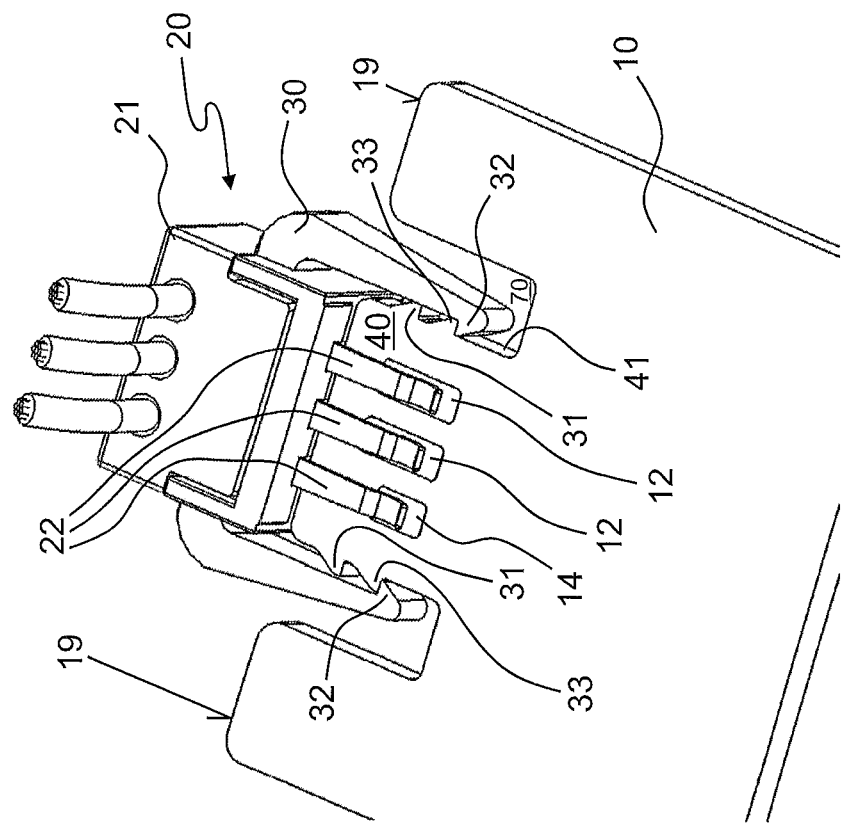
FIG. 1e shows the plug connector set according to FIG. 1d in a partially broken-away state for illustrating the complete plugging of all plug contacts.
Figure 1D:
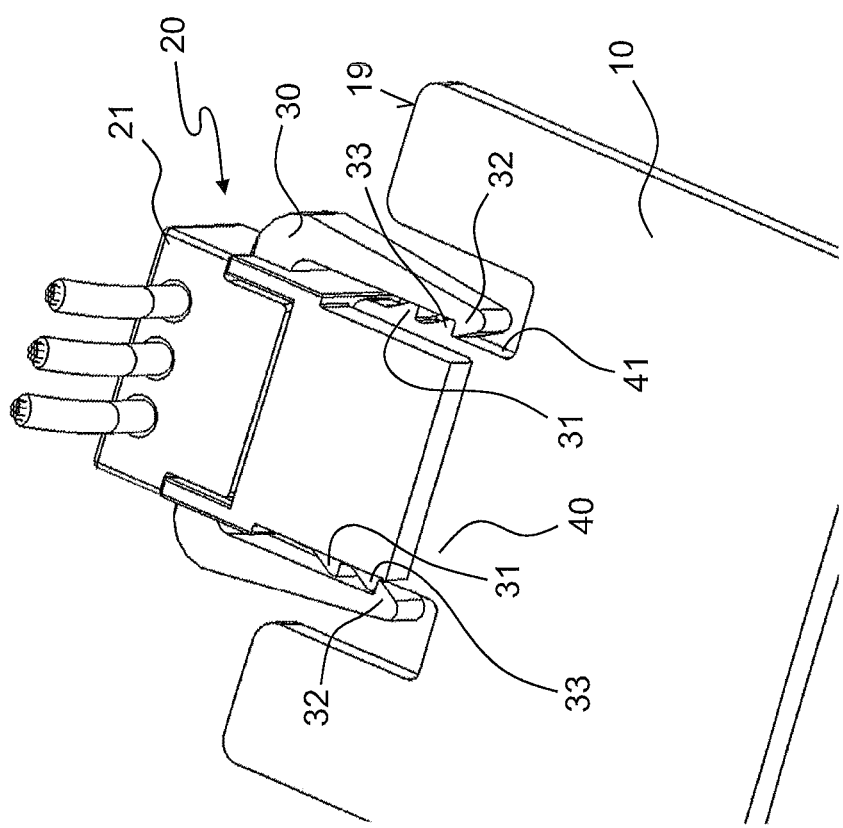
FIG. 1d shows the plug connector set according to FIG. 1b and 1c in the completely plugged state in its end position.

In FIGS. 1d and 1e, in each case the end positions are depicted in which the circuit board direct plug connector 20 is completely plugged onto the corresponding contact strip 17 of the circuit board 10. In this case, the latch elements 32 that are arranged on the spring arms 30 are latched to the latch elements 33 on the circuit board 10. In this state, all contact elements 12 and the checking contact 14 are electrically connected to the corresponding contact elements 22 of the circuit board direct plug connector 20.

In FIGS. 2d and 2e, a complete plugging of the second solution according to the invention is depicted. In this case, the third latch elements 33' that are formed on the spring arms 30 are latched to the first latch element 31 that is formed on the circuit board 10.

In FIGS. 3a to 3e and 4a to 4e, a third or a fourth exemplary embodiment of the plug contact according to the invention are depicted.

The same elements are provided with the same reference numerals as in FIG. 1a to 1e or 2a to 2e, such that reference can be made to their description above.

As can be seen from FIGS. 3a to 3e and 4a to 4e, here the contact elements 12 and the checking contact 14 are not arranged on a plugging tongue, but directly on the edge of the circuit board itself. Furthermore, the latch elements are not arranged as latch hooks on the edge bordering the plugging tongue, but as openings 51, 53 in the circuit board. Thus, the latch elements 31 correspond to the openings 51 and the third latch elements 33 to the openings 53 in FIG. 1a to 1e. In the further embodiments described in FIGS. 4a to 4e, the contact elements 12 and the checking contact 14 are also formed on the board edge next to one another and form the plug contact strip 17. Here the first contact elements 61 are formed as elongated holes and the second and third latch elements 32, 33 are formed on the circuit board plug connector 20 on the spring arms 30 arranged there. In the exemplary embodiment depicted in FIGS. 3a to 3e, the plugging processes corresponds to those of the exemplary embodiment depicted in FIGS. 1a to 1e and the plugging processes of the exemplary embodiment depicted in FIGS. 4a to 4e substantially correspond to those of the exemplary embodiment depicted in FIGS. 2a to 2e, such that reference will be made to this extent below.

The housings 21 of the circuit board direct plug connector 20 according to FIGS. 1a to 1e and 2a to 2e differ slightly to those of the circuit board direct plug connector according to FIGS. 3a to 3e and FIGS. 4a to 4e. These are, however, only constructive embodiments. The principle of the functionality is identical.

As emerges from the figures, the contact element 14 formed as a checking contact, labelled as checking contact 14 for short below, is formed in the plugging direction S to be shorter than the contact elements 12. It is formed to be so short that, during a plugging in which only the first and second latch elements 31, 32 are latched to one another, no electric contact between the checking contact 14 and the corresponding contact element 22 is produced. Only when a complete plugging is present, i.e. when the third latch elements 33 or 33' are latched, is the checking contact 14 also contacted.

In order to now determined whether a proper contacting is present, the checking contact 14 or alternatively the contact element 22 corresponding to the checking contact 14 is energised and it is determined whether a current flow between the checking contact 14 and corresponding contact element 22 is present, or vice versa from the contact element 22 to the checking contact 14. If this is the case, a proper plugging is assumed. If this is not the case, there is a contact disruption between the checking contact 14 and the corresponding contact element 22. In this case, a half-plugging or an improper plugging must be assumed. Such an improper plugging or even a half-plugging can be labelled as the first latch point. In a second latch point, a complete plugging is achieved. In this case, the first and second latch elements 31, 32 respectively 51, 32 or 61, 32 are latched to each other. Now, a clearance is provided that has a certain length in the plugging direction S that enables a movement of the second latch element 32 relative to the first latch element 31 respectively 51 or 61 in and against the plugging direction S. This clearance is 0.9 mm to 1.0 mm, for example. This is due to the functional sequence during the plugging process in conjunction with the checking contact 14. Firstly, a latching of the first and second latch elements 31, 32 respectively 51, 32 or 61, 32 takes place. This latching takes place by the mentioned amount, i.e. between 0.9 mm and 1.0 mm in front of the end positions (completely plugged state) in order to ensure that all utility contacts, i.e. all plug contact elements 12 are indeed electrically connected to the corresponding contact elements 22, however not the shorter checking contact 14 that, in this plug position, should never already be touching the corresponding contact element 22 in the plug connector 20. This state is respectively depicted in FIGS. 1c and 2c respectively 3c and 4c. Then, during assembly, the plug connector 20 is pushed completely onto the circuit board 10. In a complete pushing of the circuit board direct plug connector 20 onto the circuit board 10 onto the base, i.e. effectively as far as the stop, all plug contact elements 12 and also the checking contact 14 are electrically connected to the corresponding contact elements 22, i.e. contacted. Then, during assembly, the undesired case can occur that on the plug connector and/or on the cables that lead to it are pulled such that the plug connector 20 can be dislodged somewhat from the plug contact strip 17, i.e. dislodged somewhat from the circuit board 10. Dislodging thus takes place after an initially proper plugging. It could also occur that, during assembly of the plug connector 20 on the circuit board 10, it could indeed result in a latching of the latch element 32 and the latch element 31 respectively 51 or 61, the plug connector 20, however, not being plugged in so deep that the checking contact 14 and the corresponding contact element 22 are electrically connected to each other. During assembly, this plugging is determined and signalled as a disruption. Here, this is indeed a pseudo error that is also labelled as such since the contact elements 22 of the circuit board 10 and the plug connector 20 are correctly contacted—except for the checking contact 14. During assembly, a non-contacting of the checking contact 14 is, however, recognised as an error. In this case, the assembler would have to press the plug connector 20 again completely onto the circuit board 10 by exerting a corresponding pressure in the plugging direction S. It is obvious that, in particular with a very large number of such plug contact sets, as are installed in vehicles, for example, such an "readjusting" is a waste of time and not desirable for the assembly of vehicles on the assembly line.

In order to avoid this, the invention provides a third latch element 33, 33' in the form of a further latch nose. In the completely plugged state, i.e. when the plug connector 20 has been completely plugged onto the circuit board 10 and all contact elements 12, 14, 22 are electrically connected to one another, the third latch element 33 respectively 33' latches into the latch element 31, 51, 61, 32 and fixes the circuit board direct plug connector 20 on the circuit board 10 to be as clearance-free as possible.

The third latch element 33 respectively 33' thus enables a fixing in the complete plugged state, i.e. in a third latch point that differs from the second latch point, which is depicted in FIG. 1c, 2c respectively 3c and 4c in that, during assembly, it is ensured that the plug contact sets are completely plugged, which can be recognised by detecting a plugged checking contact 14. This state is depicted in FIG. 1d respectively 3d and in FIG. 2e respectively 4e. Thus, the circuit board direct plug connector is fixed on the circuit board 10 and indeed in such a way that even a shaking load or other mechanical load, for example a vibration load or similar, does not allow the plug connector 20 to dislodge from the circuit board 10.

A proper plugging can be determined by either energising the checking contact 14 or its corresponding contact element 22 in the plug connector 20. Here it is checked whether a current is flowing between the checking contact 14 and the corresponding contact element 22. If this is not the case, then there is no proper plugging present.

This enables an automatic checking of the plug contact set according to the invention for the presence of a half-plugging, for example, or an improper plugging. If this is detected, then the half-plugging or the improper plugging can still be corrected during the assembly process.

The invention claimed is:

1. A plug contact set, comprising a plug contact strip (17) having several first contact elements (12, 14) that are formed as components of a circuit board (10) and are arranged in the region of a circuit board edge (19), at least one of which contact elements (12, 14) being formed in the plugging direction (S) as a checking contact (14) having a smaller length than the remaining contact elements, and having a plug connector having several second contact elements (22) that are arranged in a housing (21), at least one of which contact elements (22) being set up to electrically make electric contact with the checking contact (14), wherein at least one first latch element (31, 51) that is formed as part of the circuit board (10) is arranged on the circuit board edge (19) and at least one second latch element (32) is arranged on the housing, said latch elements being set up to latch with one another when the first contact elements (12, 14) are completely contacted by the second contact elements (22), and wherein a third latch element (33, 53) that is formed as part of the circuit board (10) and that is able to latch with the second latch element (32) is provided that is arranged to be spaced apart from the first latch element (31) in the plugging direction (S) in such a way that, by latching the third latch element (33, 53) to the second latch element (32), an as clearance-free as possible fixing of the housing on circuit board (10) in the completely contacted state of the first and second plug contacts (12, 14, 22) is achieved.

2. The plug contact set according to claim 1, wherein the first contact elements (12, 14) are arranged on the circuit board (10).

3. The plug contact set according to claim 1, wherein the first and third latch elements (31, 33; 51, 53, 61) are formed in/on the circuit board (10) as a part thereof.

4. The plug contact set according to claim 3, wherein the first and third latch elements (31, 33) are in each case arranged on edges (41) which border, transversely to the plugging direction (S), a plugging tongue (40) that is formed as part of the circuit board (10).

5. The plug contact set according to claim 3, wherein the first and third latch elements (51, 53, 61) are openings in the circuit board (10).

6. The plug contact set according to claim 1, wherein the second latch elements (32) are arranged on the spring arms (30) arranged on the housing (20).

7. The plug contact set according to claim 1, wherein the latch elements (31, 32, 33') are latch hooks.

8. The plug contact set according to claim 1, wherein the plug contact strip (17) has precisely one checking contact (14).

9. The plug contact set according to claim 8, wherein the checking contact (14) is arranged centrally in the plug contact strip (17).

10. The plug contact set according to claim 8, wherein all remaining first plug contacts (12) have the same length.

11. The plug contact set according to claim 1, wherein second plug contacts (22) all have the same length in the plugging direction (S).

12. The plug contact set according to claim 1, wherein the checking contact (14) is formed to be so short that it does not come into electric contact with a second plug contact (22) when the at least one first latch element (31) is not latched to the at least one second latch element (32).

13. The plug contact set according to claim 1, wherein it has a first latch point, a second latch point and a third latch point, wherein the at least one first latch element (31) is latched in all three latch points to the at least one second latch element (32) and wherein, in the first latch point, there is not a second plug contact (22) in electrical contact with a checking contact (14) in which second, latch point at least one second plug contact (22) comes into electrical contact with a checking contact (14) and, in the third latch point, all first and second plug contacts (12, 14; 22) have come into contact with one another and the two housing parts (11, 21) are fixed to one another.

14. The plug contact set according to claim 1, wherein the first contact elements (12, 24) are contact surfaces on the circuit board (10) and the second contact elements (22) are spring contact elements.

15. A method for checking a latching of the at least one first latch element (31) to the at least one second and third latch element (32, 33) of the plug contact set according to claim 1, comprising
  energizing a checking contact (14)
  checking whether a current is flowing between the checking contact (14) and a second plug contact (22), and
  determining that a latching is present when a current flow has been detected.

16. A method for checking a latching of the at least one first latch element (31) to the at least one second and third latch element (32, 33) of the plug contact set according to claim 1, comprising
  energizing a second plug contact (22) which is configured to come into electrical contact with a checking contact (14),
  checking whether a current is flowing between the checking contact (14) and this second plug contact (22), and determining that a latching is present when a current flow has been detected.

17. A plug contact set, comprising a plug contact strip (17) having several first contact elements (12, 14) that are formed as components of a circuit board (10) and are arranged in the region of a circuit board edge (19), least one of which contact elements (12, 14) being formed in the plugging direction (S) as a checking contact (14) having a smaller length than the remaining contact elements, and having a plug connector having several second contact elements (22) that are arranged in a housing (21), at least one of which contact elements (22) being set up to electrically make electric contact with the checking contact (14), wherein at least one first latch element (31, 51) that is formed as part of the circuit board (10) is arranged on the circuit board edge (19) and at least one second latch element (32) is arranged on the housing (21), said latch elements being set up to latch with one another when the first contact elements (12, 14) are completely contacted by the second contact elements (22), and wherein a third latch element (33') that is arranged on the housing (21) and that is able to latch with the first latch element (31, 61), said third latch element (33') being arranged to be spaced apart from the second latch element (32) in the plugging direction (S) in such a way that, by latching the third latch element (33') to the first latch element (31, 61), a fixing of the housing (21) that is as clearance-free as possible on the circuit board (10) in the completely contacted state of the first and second plug contacts (12, 14, 22) is achieved.

18. The plug contact set according to claim 17, wherein the second and third latch elements (32, 33') are arranged on the spring arms (70) arranged on the housing (20).

\* \* \* \* \*

UNITED STATES PATENT AND TRADEMARK OFFICE
CERTIFICATE OF CORRECTION

PATENT NO. : 10,601,156 B2
APPLICATION NO. : 16/300667
DATED : March 24, 2020
INVENTOR(S) : Lappoehn Page 1 of 1

It is certified that error appears in the above-identified patent and that said Letters Patent is hereby corrected as shown below:

In the Claims

Claim 11, Line 2 (Column 10, Line 26), before "second" please insert --the--.
Claim 13, Line 7 (Column 10, Line 39), after "second" please delete ",".
Claim 17, Line 4 (Column 11, Line 6), before "least" please insert --at--.

Signed and Sealed this
Fifth Day of May, 2020

Andrei Iancu
*Director of the United States Patent and Trademark Office*